(12) United States Patent
Fukumoto

(10) Patent No.: US 7,067,412 B2
(45) Date of Patent: Jun. 27, 2006

(54) SEMICONDUCTOR DEVICE AND METHOD OF MANUFACTURING THE SAME

(75) Inventor: Akira Fukumoto, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/678,200

(22) Filed: Oct. 2, 2003

(65) Prior Publication Data

US 2004/0072415 A1   Apr. 15, 2004

(30) Foreign Application Priority Data

Oct. 10, 2002   (JP) .................................. 2002-297982

(51) Int. Cl.
*H01L 21/44* (2006.01)
*H01L 21/4763* (2006.01)

(52) U.S. Cl. .................... 438/599; 438/646; 438/596

(58) Field of Classification Search ......... 438/595–596, 438/598–599, 689, 584, 645–646, 656, 692, 438/758, 789; 257/210

See application file for complete search history.

(56) References Cited

U.S. PATENT DOCUMENTS

| | | | | |
|---|---|---|---|---|
| 5,171,701 A | * | 12/1992 | Nagamatsu | 438/598 |
| 5,381,036 A | * | 1/1995 | Bigler et al. | 257/666 |
| 5,610,831 A | * | 3/1997 | Matsumoto | 716/19 |
| 5,618,744 A | * | 4/1997 | Suzuki et al. | 438/599 |
| 5,705,407 A | * | 1/1998 | Dunn et al. | 438/599 |
| 5,846,874 A | * | 12/1998 | Hartranft et al. | 438/598 |
| 5,888,900 A | | 3/1999 | Mizuno et al. | |
| 6,285,074 B1 | * | 9/2001 | Sugiyama et al. | 257/666 |
| 6,448,591 B1 | * | 9/2002 | Juengling | 257/211 |
| 6,451,680 B1 | * | 9/2002 | Wang | |
| 6,559,476 B1 | * | 5/2003 | Lin | 257/48 |
| 6,627,549 B1 | * | 9/2003 | Juengling | 438/689 |
| 6,632,696 B1 | * | 10/2003 | Kimura et al. | 438/30 |
| 6,633,077 B1 | * | 10/2003 | Ogata et al. | 257/676 |
| 6,653,717 B1 | * | 11/2003 | Jain et al. | 257/632 |
| 2002/0048923 A1 | * | 4/2002 | Chen | 438/599 |
| 2002/0063332 A1 | * | 5/2002 | Yamaguchi et al. | 257/738 |
| 2002/0117698 A1 | * | 8/2002 | Inumiya et al. | 257/288 |
| 2002/0175298 A1 | * | 11/2002 | Moniwa et al. | 250/492.22 |
| 2002/0192934 A1 | * | 12/2002 | Jeong | 438/598 |
| 2003/0034562 A1 | * | 2/2003 | Hokari | 257/773 |
| 2003/0216022 A1 | * | 11/2003 | Mayuzumi | 438/595 |
| 2004/0056351 A1 | * | 3/2004 | Wu et al. | 257/737 |
| 2004/0065907 A1 | * | 4/2004 | Maeno et al. | 257/211 |

FOREIGN PATENT DOCUMENTS

| | | | |
|---|---|---|---|
| JP | 61-59739 | | 3/1986 |
| JP | 405013678 A | * | 1/1993 |
| JP | 6-29285 | | 2/1994 |
| JP | 7-333854 | | 12/1995 |
| JP | 9-45686 | | 2/1997 |
| JP | 410098122 A | * | 4/1998 |
| JP | 10-163210 | | 6/1998 |

* cited by examiner

*Primary Examiner*—Chuong Anh Luu
(74) *Attorney, Agent, or Firm*—Hamre, Schumann, Mueller & Larson, P.C.

(57) ABSTRACT

The present invention provides a semiconductor device including a plurality of wirings or conductive film patterns formed on a semiconductor substrate, and clearances are provided between the wirings or the conductive film patterns. On a corner or an end part of at least one of the wirings or the conductive film patterns, protrusions are formed to protrude, facing the clearances between the wirings or the conductive film patterns. Thereby, defects will not occur in the insulating protective film after an etching step for forming an aperture for exposing a bonding pad, and thus, a semiconductor device is manufactured without being subjected to an additional process that raises the manufacturing cost. The present invention provides also a method of manufacturing the semiconductor device.

18 Claims, 11 Drawing Sheets

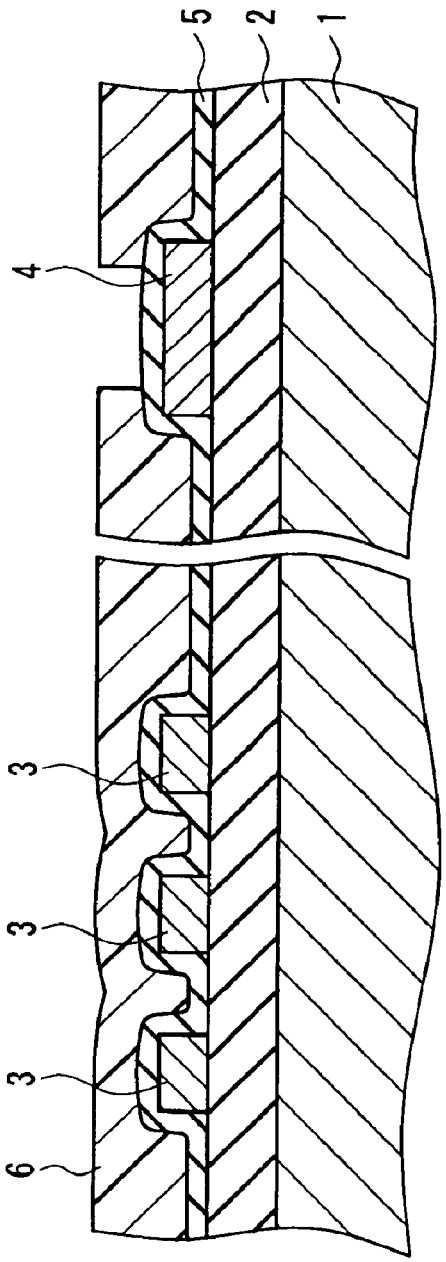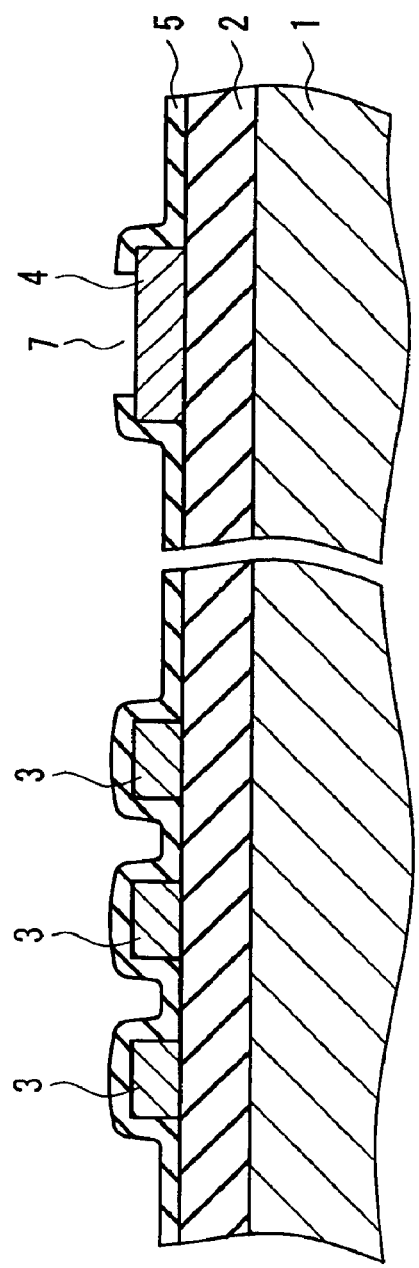
FIG. 7A PRIOR ART
FIG. 7B PRIOR ART

US 7,067,412 B2

SEMICONDUCTOR DEVICE AND METHOD OF MANUFACTURING THE SAME

FIELD OF THE INVENTION

The present invention relates to a wiring layout for a semiconductor device, a semiconductor device including the layout, and a method of manufacturing the same.

BACKGROUND OF THE INVENTION

In a conventional semiconductor integrated circuit formed on a semiconductor substrate, a plurality of metal wirings are formed by patterning a metal film such as an aluminum alloy film in order to connect semiconductor elements on the substrate to each other or to a bonding pad. In a multilayer wiring structure, the metal wirings on the outermost surface are coated with a moisture-proof insulating protective film for preventing corrosion of the metal wirings, then an aperture is formed to expose the bonding pad, and thus the wiring process is completed.

FIGS. 7A and 7B are cross-sectional views showing a final step of a typical wiring formation in a conventional manner. These figures show wirings arranged at a proper spacing within an integrated circuit, together with a bonding pad. As shown in FIG. 7A, an insulating film 2 is formed on a semiconductor substrate 1. The insulating film 2 comprises in general a multilayer film comprising, for example, a silicon oxide film of BPSG (boro-phospho-silicate glass) and TEOS (tetraethylorthosilicate). Though not shown in FIG. 7A or 7B, active elements such as a transistor are formed on the semiconductor substrate 1 and covered with the insulating film 2. Though not shown in FIG. 7A or 7B, the elements including the transistor pass through the insulating film 2 so as to be connected to internal wirings. A circuit internal wiring 3 comprising an aluminum alloy film and a bonding pad 4 are formed on the insulating film 2, further on which a protective film 5, such as a PSG (phospho-silicate glass)/silicon nitride (SiN) film and a SiN film, is formed. Furthermore, a resist film 6 is applied thereto. Next, as shown in FIG. 7B, the resist film 6 is used as a mask for etching the protective film 5. An aperture 7 for wire bonding is formed on the bonding pad 4 so as to expose the surface of the bonding pad 4, and then the resist film 6 is removed.

JP 61 (1986)-59739 suggests a method of laminating a silicon nitride film and a silicon oxide film on an aluminum wiring and forming an electrode takeoff by etching with a use of a resist as a mask.

In a large-scale semiconductor integrated circuit, several dozens of wirings are arranged in parallel and the wirings are often bent at a right angle. Such wirings are formed, e.g., in the vicinity of a power source around a semiconductor chip or around a memory circuit part. FIG. 8 shows corners of three aluminum alloy wirings 8. As shown in FIG. 8, the wirings can cause defects 9 in the insulating protective film in clearances between the wirings at the corner. The defects 9 are found during an examination of the protective film surface from which the resist film has been removed subsequent to formation of an aperture for wire bonding in accordance with the step indicated in FIGS. 7A and 7B.

The defects in an insulating protective film may allow water or the like to penetrate into the wiring layer disposed beneath and cause corrosion. As a result, reliability as a semiconductor integrated circuit will be damaged considerably.

SUMMARY OF THE INVENTION

For solving the above-mentioned problems, an object of the present invention is to provide a semiconductor device, and a method of manufacturing the same. The semiconductor device can be manufactured without being subjected to any additional steps that will raise the cost, since substantially no defects occur in the insulating protective film after an etching step for forming an aperture to expose the bonding pad.

For achieving the object, a semiconductor device of the present invention includes a plurality of wirings or conductive film patterns on a semiconductor substrate, and clearances are formed between the wirings or the conductive film patterns. The semiconductor device is characterized in that a protrusion is formed at a corner or an end part of at least one of the wirings or the conductive film patterns so that the protrusion faces the clearance.

A method of manufacturing a semiconductor device according to the present invention includes: forming a plurality of wirings or conductive film patterns on a semiconductor substrate by photolithography and etching, and also forming clearances between the wirings or the conductive film patterns. The semiconductor device is characterized in that a protrusion is formed at a corner or an end part of at least one of the wirings or the conductive film patterns so that the protrusion faces the clearance.

BRIEF DESCRIPTION OF THE DRAWINGS

FIGS. 7A and 7B are cross-sectional views showing a conventional process for forming an aperture for exposing a bonding pad.

DETAILED DESCRIPTION OF THE INVENTION

Figure 1A:
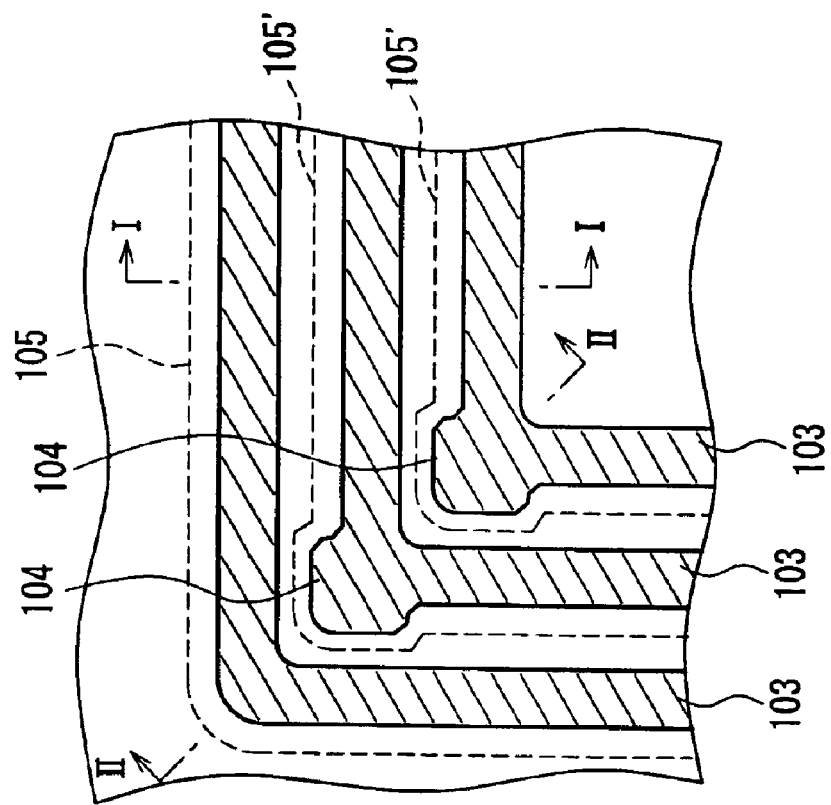
FIGS. 1A and 1B are wiring diagrams showing layouts according to a first embodiment of the present invention.

In the present invention, a protrusion is formed at a corner or an end part of at least one of a plurality of wirings or conductive film patterns on a semiconductor substrate, and the protrusion is directed to a clearance provided between adjacent wirings or the conductive film patterns. This structure is useful in avoiding a disadvantage that the insulating protective film has holes at positions other than the position on the bonding pad, during a subsequent etching step for forming an aperture to expose the bonding pad. Therefore, the present invention substantially does not require any additional steps that will raise the manufacturing cost, i.e., steps of increasing the thickness of a resist and smoothing the insulating protective film as an undercoat, and furthermore, the dimension of the semiconductor chip will not be increased.

The protrusion can be directed outward from the corner of the wiring. Alternatively, the protrusion can be shaped as an inward extension to bridge the corner.

The plural conductive film patterns can be provided with a T-shaped groove or a cross-shaped groove for separating the patterns, and a protrusion can be formed at a corner of at least one of the conductive film patterns positioned at a crossing of the respective groove portions constituting the T-shaped groove or the cross-shaped groove.

The plural wirings including a first wiring and a second wiring are formed substantially in parallel with a predetermined spacing on the semiconductor substrate, and an end part of the second wiring is positioned along one side of the first wiring. At least one protrusion can be formed at the end part of the second wiring so as to protrude toward the first wiring, or at least one protrusion is formed at the side of the first wiring that faces the second wiring, so that the protrusion protrudes toward the second wiring.

The protrusion has an area ranging from about 0.2 $\mu m^2$ to about 3.0 $\mu m^2$ depending on the thickness or density of the wirings, or preferably, ranging from 0.7 $\mu m^2$ to 1.5 $\mu m^2$.

It is also preferable that the semiconductor substrate is provided further with a bonding pad made of the same film as the wirings or the conductive film patterns, and an insulating protective film coated on the wirings or the conductive film patterns and provided with an aperture to expose the surface of the bonding pad.

According to the manufacturing method, the protrusions are formed at predetermined portions of wirings arranged in parallel or conductive film patterns made of a metal film or the like, so that the clearances between the wirings or the conductive film patterns can be decreased. Accordingly, a protective insulating film formed thereon can contact with any portions on the surface of the clearances between the wirings or the conductive film patterns so as to prevent defects in the protective insulating film.

It is preferable in the method of manufacturing the semiconductor device according to the present invention that the method comprises further: forming, on the semiconductor substrate, a bonding pad made of the same film as the wirings or the conductive film patterns; forming an insulating protective film for covering the wirings, the conductive film patterns and the bonding pad; forming a patterned photosensitive resin film on the insulating protective film; and etching selectively the insulating protective film by using the photosensitive resin film as a mask, thereby forming an aperture in the insulating film so as to expose the bonding pad.

Conventionally, an insulating protective film may have unnecessary holes at some portions due to a step of forming an aperture for exposing a bonding pad. The present invention can solve the problem by forming protrusions at corners inward or outward of the wirings formed on the semiconductor substrate. Since the modifications according to the present invention involves only the wiring layout, the present invention substantially does not require any additional steps that will raise the manufacturing cost, i.e., steps of increasing the thickness of a resist and smoothing the insulating protective film as an undercoat. Furthermore, the dimension of the semiconductor chip will not be increased.

Specific embodiments of the present invention will be described below by referring to the attached drawings.

(First Embodiment)

Figure 1B:
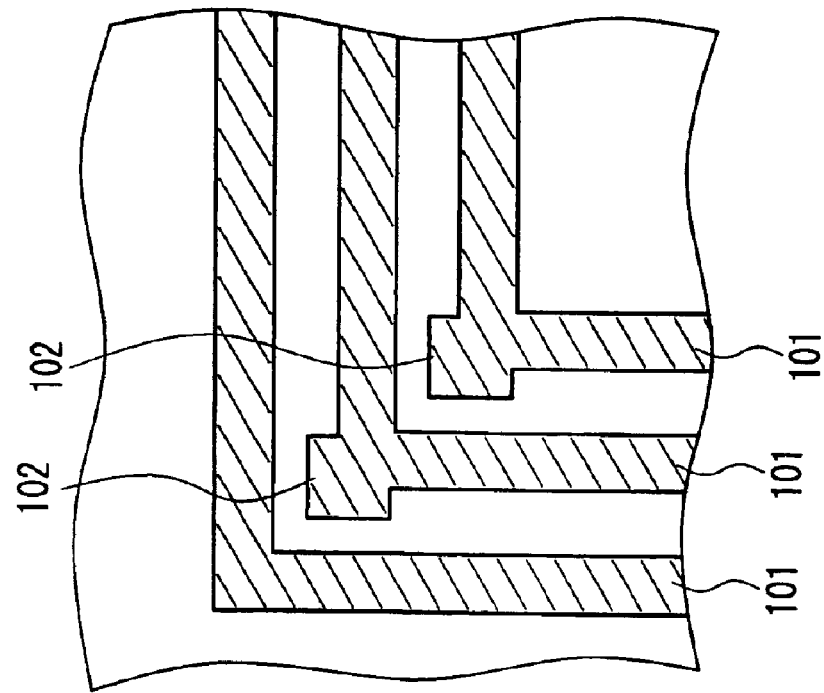

FIGS. 1A and 1B are wiring diagrams, each of which shows a layout of an outermost layer of multilayer wirings according to a first embodiment. Each of FIGS. 1A and 1B shows corners of three of plural wirings arranged on a semiconductor chip, and the three wirings are bent at substantially 90°. FIG. 1A shows a wiring pattern layout on a reticle, and FIG. 1B shows a wiring pattern formed on a semiconductor substrate. Though a plurality of wiring patterns 101 are arranged in parallel as in a conventional manner, protrusions 102 are formed at the corners outward of the inner wiring patterns 101. In this structure, clearances between the wiring patterns 101 are decreased around the corners, while originally designed clearances are kept at the parallel parts. It is preferable that the clearances between the protrusions 104 and the wirings 103 are set not to be smaller than a minimum under a rule for pattern designing, so that a short between wirings during photolithography can be prevented. Wirings formed by using the reticle maintain substantially the reticle pattern though the edges of wirings 103 and protrusions 104 are somewhat rounded as shown in FIG. 1B. In an example, a conductive film having a thickness of 0.3 μm to 1.0 μm and made of an aluminum alloy such as AlCu or AlSiCu is applied by etching or the like on an insulating film formed on a semiconductor substrate. Resists are formed at portions to make wirings by photolithography, and etched to remove the conductive film between the wirings, then the resists are removed.

In the example of FIG. 1B, the width of the wirings is 0.6 μm, a distance between the wirings is 0.8 μm, and one protrusion has an area of 0.8 $\mu m^2$. Here, the area of one protrusion denotes a difference between an area of a wiring pattern of the present invention (FIG. 1B) and that of a conventional wiring pattern as illustrated in FIG. 9.

The above-described wiring pattern is useful in preventing the defects that can occur conventionally in an insulating protective film after forming an aperture in an insulating protective film so as to expose a bonding pad.

The above-mentioned effects of the present invention will be specified further below. First, the inventors verified through examinations a cause of the defects in an insulating protective film made of SiN or the like. FIG. 9 shows corners of wirings 8 in a conventional layout formed on a semiconductor chip. Though not shown in FIG. 9, an insulating protective film is formed on the wirings 8. Dotted lines along the wirings 8 denote edges of the insulating protective film on the surface of each wiring 8. Depending on the thickness of the insulating protective film, the edges of the insulating protective film on the adjacent wirings 8 come to contact with each other in regions where the wirings 8 are in parallel, thereby sealing the clearance between the wirings 8 (FIG. 10A). This will occur often at portions where the wirings are arranged at a narrow spacing. At a corner, the clearance between the corners of the adjacent wirings is wider (1.41 times the parallel parts), and thus the edges of the insulating protective film are not contacted with each other, and concavities 10 are formed (FIG. 10B).

Figure 9:
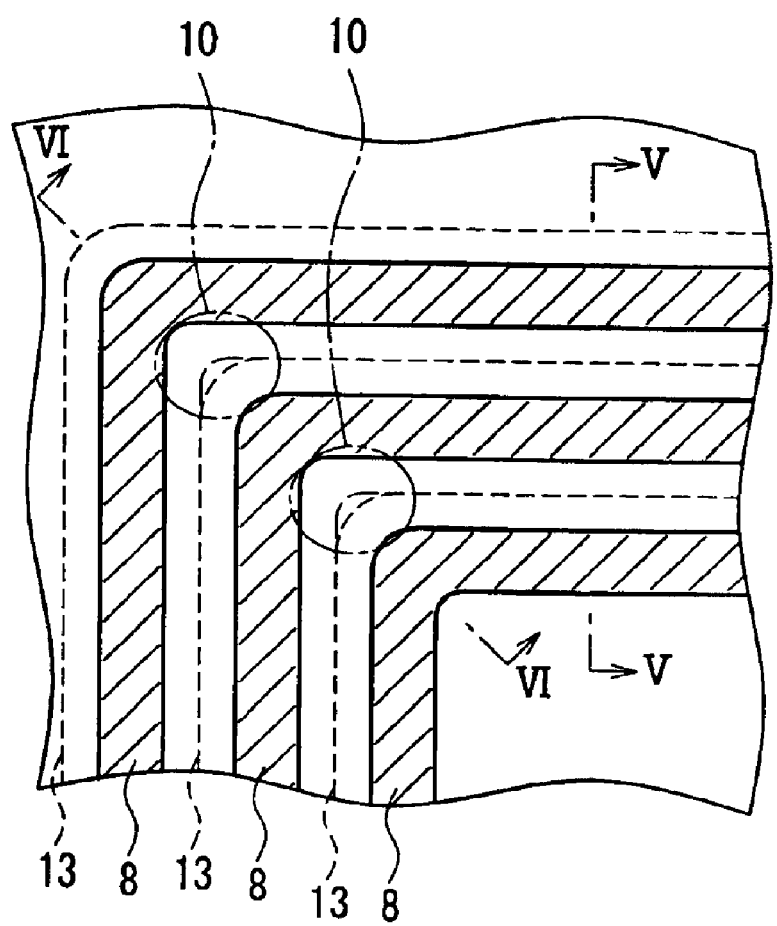
FIG. 9 is a wiring diagram showing a conventional layout coated with an insulating protective film.
Figure 10A:
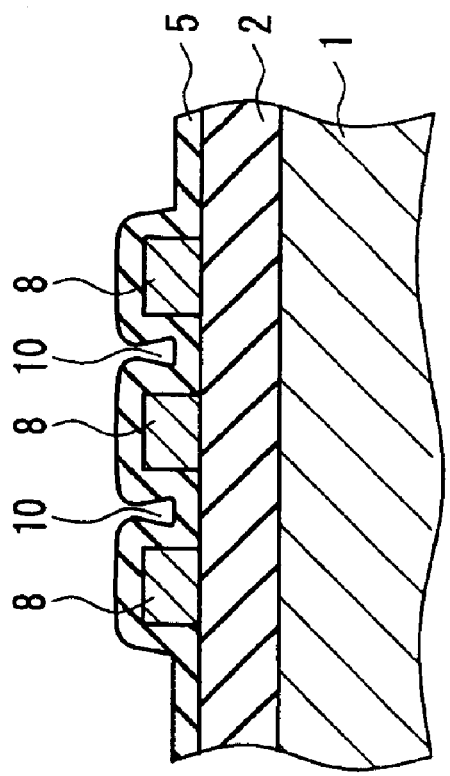
FIG. 10A is a cross-sectional view taken along a line of V—V in FIG. 9, or lines of I—I and II—II in FIG. 1B.

FIG. 10A is a cross-sectional view taken along a line of V—V in FIG. 9, in which an insulating protective film 5 of SiN is formed by a plasma CVD for accelerating the growth rate. The insulating protective film 5 on the wirings 8 cannot cover the wirings 8 fully, and thus it is contacted with each other at the upper portions of the clearances while voids 11 are formed at the bottom. As shown in FIG. 10A, the cross section of the insulating protective film formed at sides of each wiring is thick at the upper portions and thin at the bottoms of the wirings. Here, the term "edge" of an insulating protective film denotes an edge at the thickest portion, and it is indicated with each of dotted lines 13 in FIG. 9. FIG. 10B is a cross section taken along the line of VI—VI in FIG. 9. Since the clearance between the wirings is the bigger at the corners, the edges of the insulating protective film 5 are not contacted with each other at the upper portions of the wirings 8, thereby forming concavities 10.

Figure 10B:
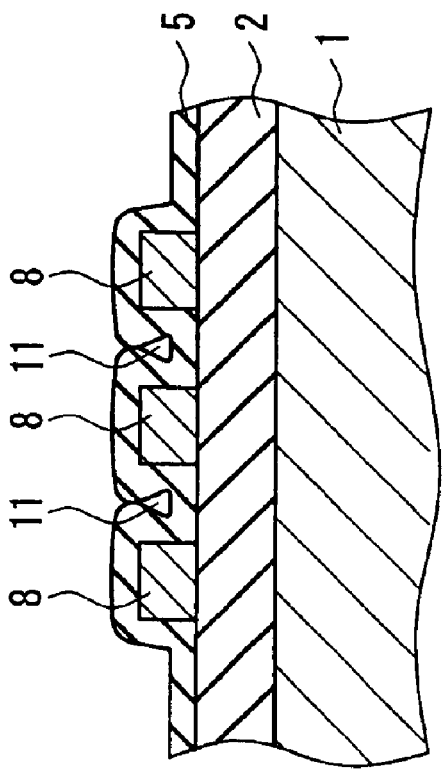
FIG. 10B is a cross-sectional view taken along a line of VI—VI in FIG. 9B.
Figure 11A:
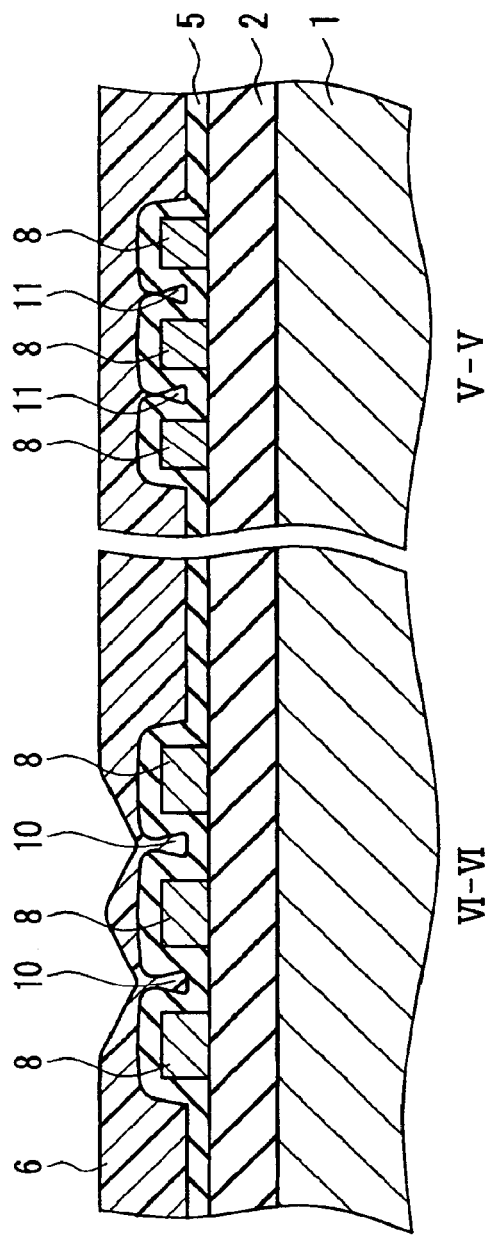
FIG. 11A is a cross-sectional view taken along a line of V—V and FIG. 11B is a cross-sectional view taken along a line of VI—VI in FIG. 9, which show occurrence of defects during a conventional step of forming an aperture for exposing a bonding pad.
Figure 11B:
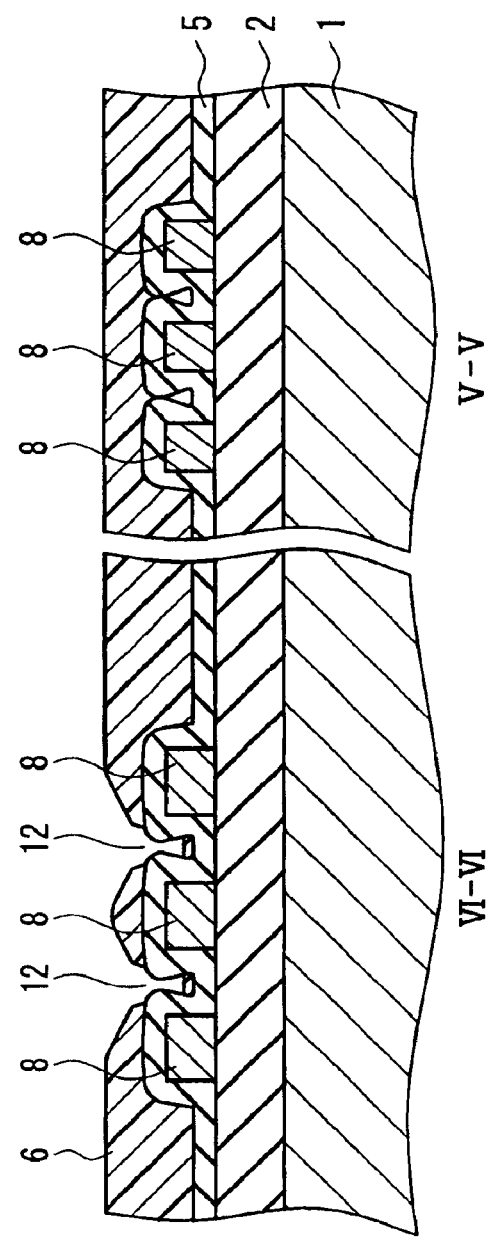

FIGS. 11A–11B include cross-sectional views showing a process of forming apertures in the insulating protective film to expose the bonding pad, when the insulating protective films are in a state as shown in FIGS. 9 and 10A, 10B. FIGS. 11A and 11B are cross-sectional views respectively taken along the lines of V—V and VI—VI in FIG. 9, from which the bonding pads are omitted. As shown in FIG. 11A, a resist film 6 applied on the portion where the wirings 8 are in parallel (V—V cross section in FIG. 9) has a substantially plane surface since the edges of the insulating protective film 5 are contacted with each other to seal the clearances between the wirings 8. However, since a part of the material of the resist film 6 will flow into the voids 11 through the concavities 10 formed in the insulating protective film 5 between the wirings 8 at the corners (VI—VI cross section in FIG. 9), the thickness of the resist film 6 on the concavities 10 will be decreased.

Figure 8:
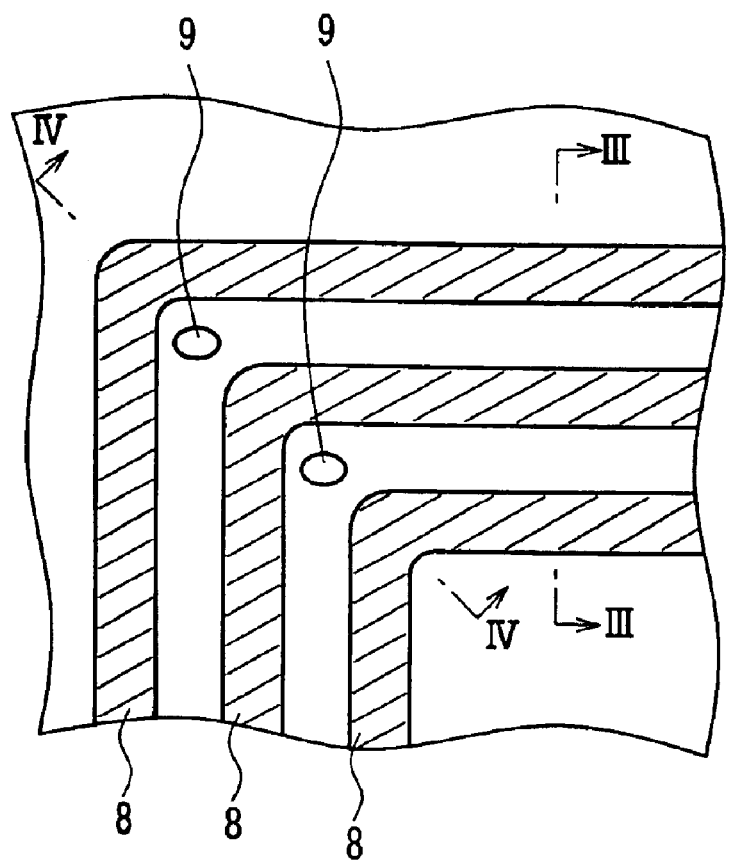
FIG. 8 is a wiring diagram showing a conventional layout with wirings bent at a corner and defects in an insulating protective film.

After a patterning process, the resist film 6 is subjected to a post baking-curing treatment at about 100° C. to 140° C. At this time, a gas in the voids 11 expands and blows off the thin portions of the resist film 6, and thus the resist film 6 has holes. In this manner, the resist defects 12 are formed (the VI—VI cross section in FIG. 11B). The insulating protective film 5 is removed from the resist defects 12 when etching is carried out for forming apertures in the insulating protective film 5 in order to expose the bonding pad, and thus defects 9 are formed in the insulating protective film as shown in FIG. 8. Alternatively, even if the resist film 6 is not blown off, it will be removed during a subsequent etching step, and the thus exposed insulating protective film is etched further to cause defects 9. The cross section taken along the line of V—V in FIG. 11B corresponds to the cross section taken along the line of III—III in FIG. 8, while the cross section taken along the line of VI—VI in FIG. 11B corresponds to the cross section taken along the line of IV—IV in FIG. 8.

According to the first embodiment of the present invention, the protrusions 104 are formed outward the corners of the wirings (FIG. 1B) so as to decrease a distance between the adjacent wirings. Therefore, the edges of the insulating protective film on the adjacent wirings 103 will be contacted easily so as to prevent the formation of the concavities 10 as shown in FIGS. 9 and 10B.

The dotted lines 105 and 105' in FIG. 1B denote edges of the insulating protective film on the wirings 103. In the cross section taken along the line I—I, edges 105' will be contacted with each other. Similarly, the clearances between the wirings 103 are decreased at the corners as well in the cross section taken along the line II—II (FIG. 10A), and thus the edges 105' in the insulating protective film on the wirings 103 will be contacted with each other. Since concavities 10 as shown in FIG. 9 will not be formed, defects in the insulating protective film can be prevented.

In the first embodiment, protrusions are formed outside the corners of the wirings. Alternatively, protrusions can be formed inside, or at both sides of the corners of the wirings so as to decrease the clearances between the wirings.

(Second Embodiment)

Figure 2:
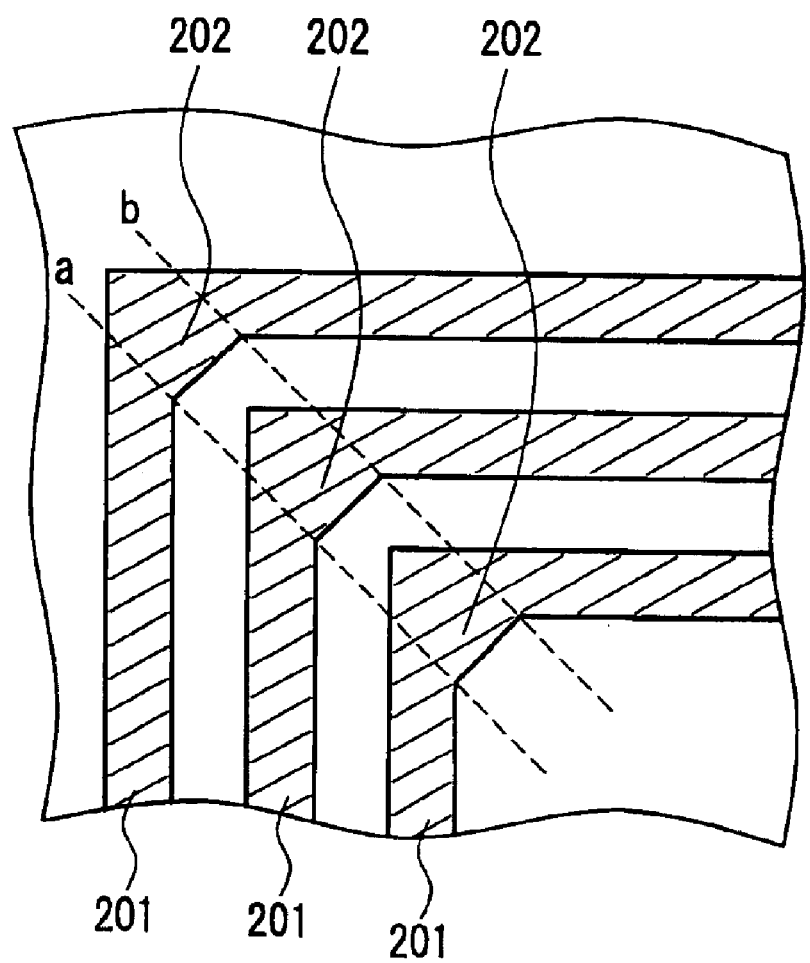
FIG. 2 is a wiring diagram showing a layout according to a second embodiment of the present invention.

FIG. 2 is a wiring diagram showing a layout according to a second embodiment. In this layout, inward extensions (triangular protrusions) 202 are formed to bridge corners of wirings 201 made of an aluminum alloy film or the like.

In the example of FIG. 2, each wiring has a thickness of 0.6 μm, a distance between the adjacent wirings is 0.8 μm, and an extension has an area of 0.15 μm$^2$.

FIG. 2 shows that this structure contributes to decrease a distance between an outward top of each of the inner wirings 201 at the corners and each of the extensions 202, in comparison with a conventional layout as shown in FIG. 8. Accordingly, edges in the insulating protective film on the adjacent wirings 201 can be contacted with each other so as to prevent defects in the protective film even after a step of forming an aperture in the insulating protective film so as to expose a bonding pad. Furthermore, since the extensions 202 in this embodiment has a simple shape in comparison with the protrusions 104 in the first embodiment, the mask can be designed easily.

Figure 6:
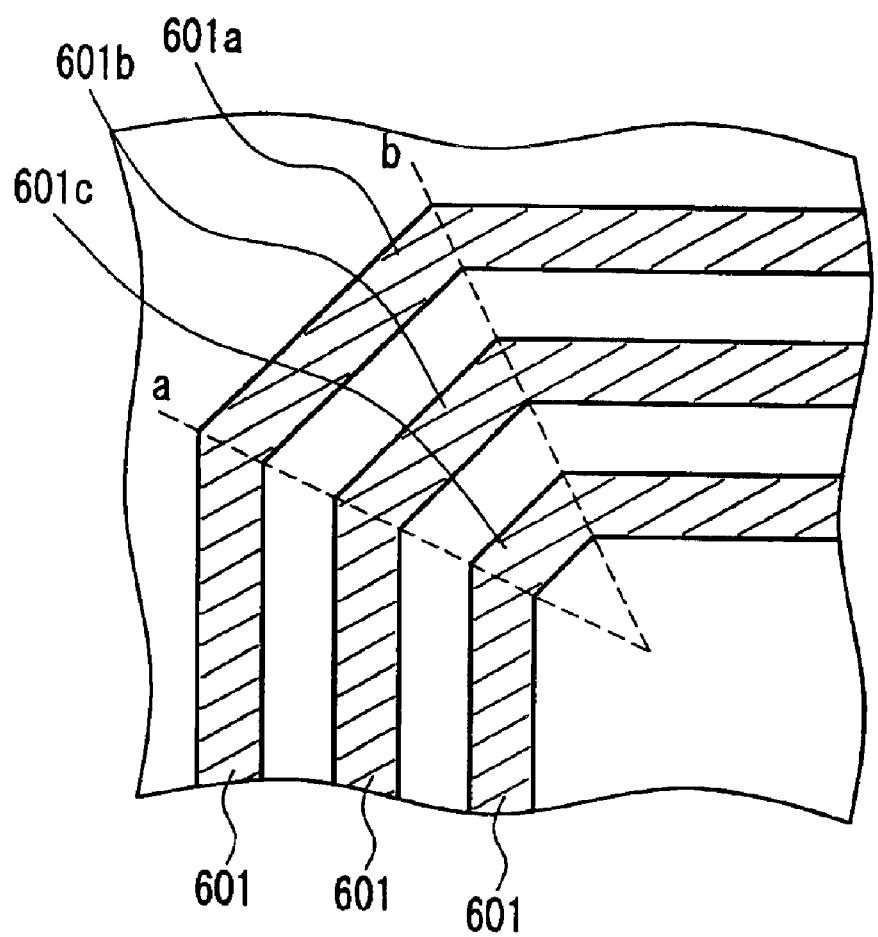
FIG. 6 is a wiring diagram showing a conventional layout having wirings bent at a corner.

FIG. 6 shows a modified example of a conventional layout. In FIG. 6, a plurality of wirings arranged in parallel are inclined by 45° at corners without changing the clearances between the wirings. In this case, the distance between the wirings at corners (601a–601c) does not change. However, since lines 'a' and 'b' linking the corners of the respective wirings cross each other at a certain point located inside the wirings, the numbers of the inclined wirings will be limited. Furthermore, this layout will lead to an increase in the area for the wirings on a semiconductor chip.

In a layout of the present invention as shown in FIG. 2, lines 'a' and 'b' linking the corners are parallel. As a result, the numbers of the wirings will not be limited, and all of the wirings can have the extensions 202 so as to prevent defects in the insulating protective film.

The above description concerns a layout composed of a plurality of wirings having corners. Other layouts may have defects in the protective film after a process of etching to form an aperture in the insulating protective film so as to expose a bonding pad. The present invention can be applied to prevent such problems.

(Third Embodiment)

Figure 3:
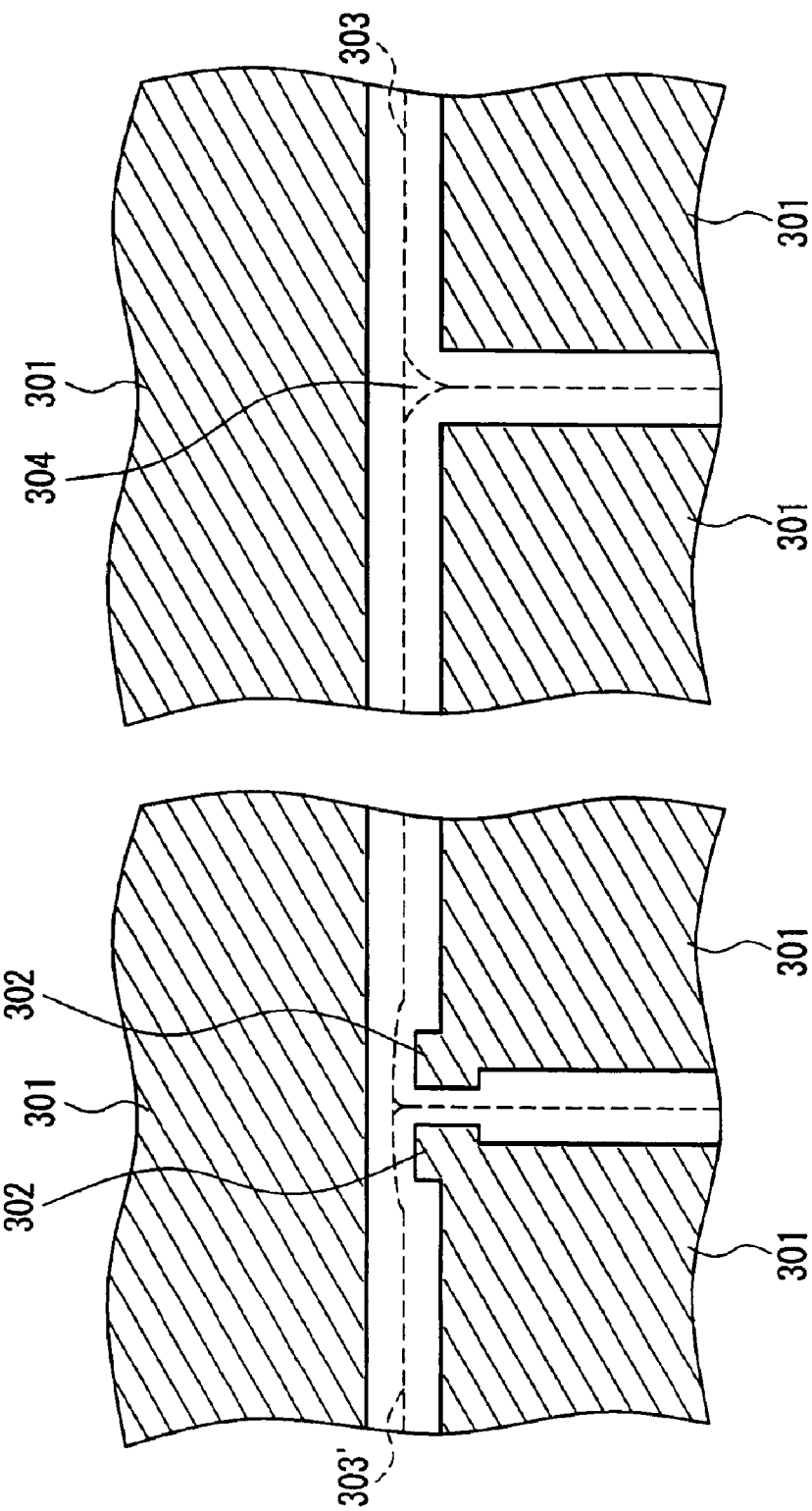
FIGS. 3A and 3B are wiring diagrams showing layouts according to a third embodiment of the present invention.

FIG. 3A shows a layout of a metal film pattern made of a wiring aluminum alloy or the like according to a third embodiment. FIG. 3B is a conventional layout shown for comparison, where a clearance between patterns 301 forms a T-shaped groove. When coating three metal patterns 301 and depositing an insulating protective film of SiN or the like by a plasma CVD or the like, the insulating protective film will have edges due to the metal patterns 301 as indicated as the dotted lines 303. A cross point in the T-shaped groove forms a concavity 304 at which the edges of the insulating protective film are not contacted with each other. That is, the insulating protective film may have a defect at this portion.

A layout of the present invention shown in FIG. 3A includes three large metal patterns 301 made of the same metal layer as an integrated circuit internal wiring layer, forming a T-shaped groove. Protrusions 302 are formed at the corners of the metal patterns positioned at the cross point of the groove.

In the example in FIG. 3A, a distance between the metal patterns is 1.0 μm, and one protrusion has an area of 0.15 μm$^2$.

In this structure, the groove is narrowed, and the edges 303' formed due to the three metal patterns 301 are contacted at the cross point of the groove portions, and thus the concavity 304 is eliminated substantially. This is useful in preventing defects in the insulating protective film even after an etching step for forming an aperture to expose a bonding pad.

In FIG. 3A, protrusions 302 are formed at two corners of the metal patterns 301. A protrusion can be formed at one part, or at least one protrusion can be formed at an end part of a metal pattern other than the corners around the cross point, depending on the condition of the insulating protective film.

Figure 4:
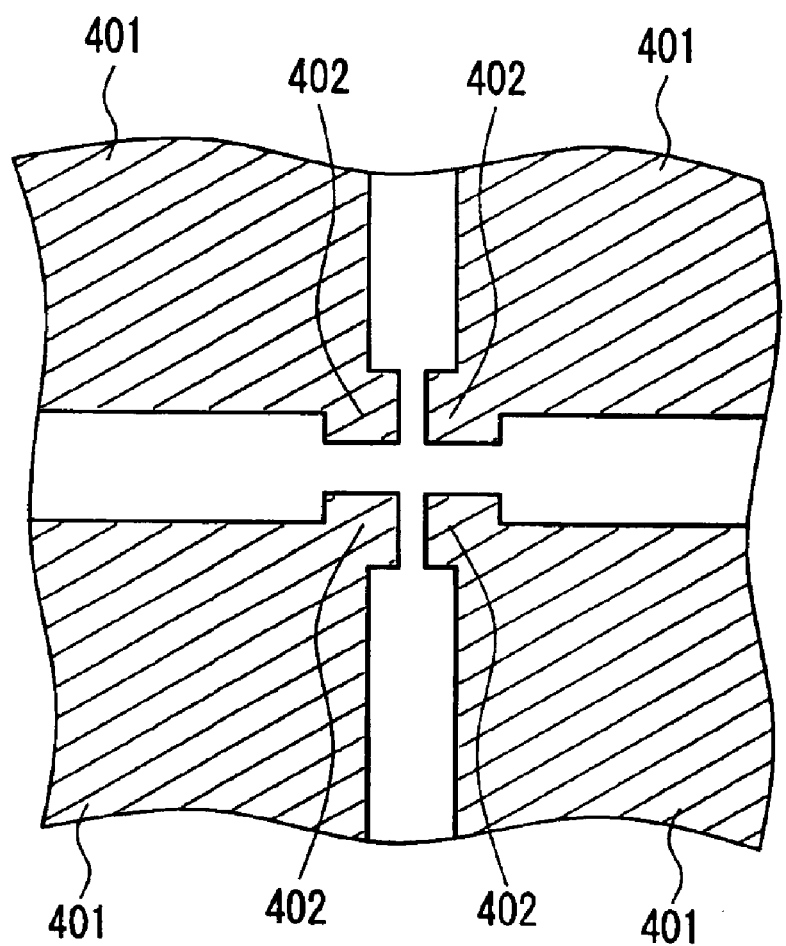
FIG. 4 is a wiring diagram showing a variation of a layout according to the third embodiment of the present invention.

FIG. 4 shows a variation of the layout according to the third embodiment, i.e., a cross-shape groove formed by metal patterns 401. Four protrusions 402 are formed at four corners of the metal patterns 401 in the same manner as shown in FIG. 3A. Alternatively, protrusions can be formed at one to three corners, depending on the condition of the insulating protective film on the cross point.

(Fourth Embodiment)

Figure 5C:
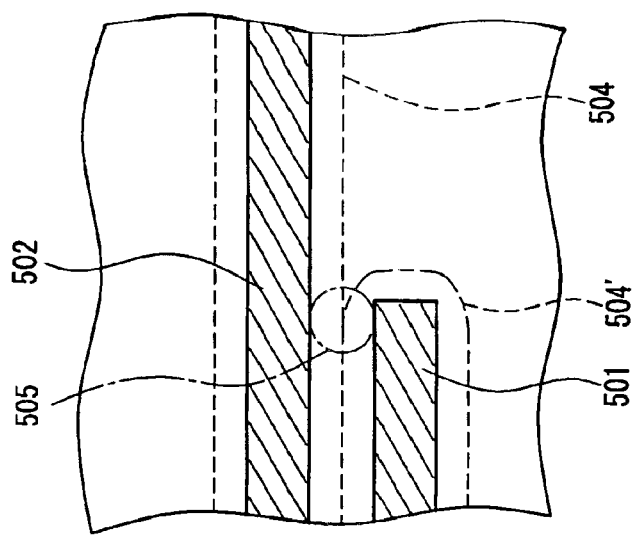
FIGS. 5B and 5C are wiring diagrams showing respectively variations of the layout of FIG. 5A.
Figure 5B:
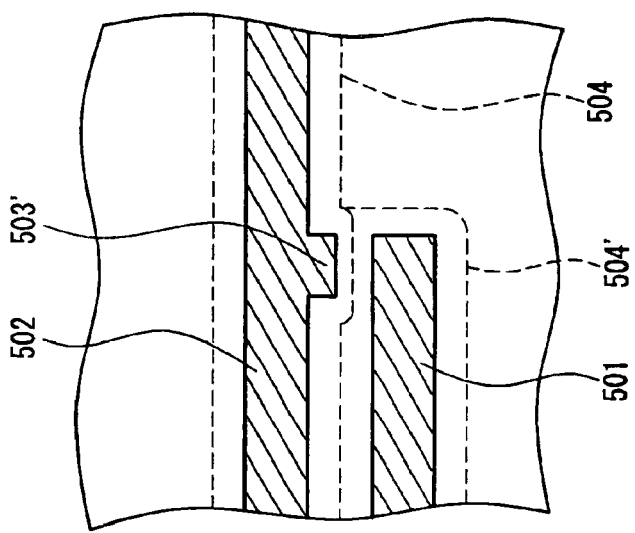
Figure 5A:
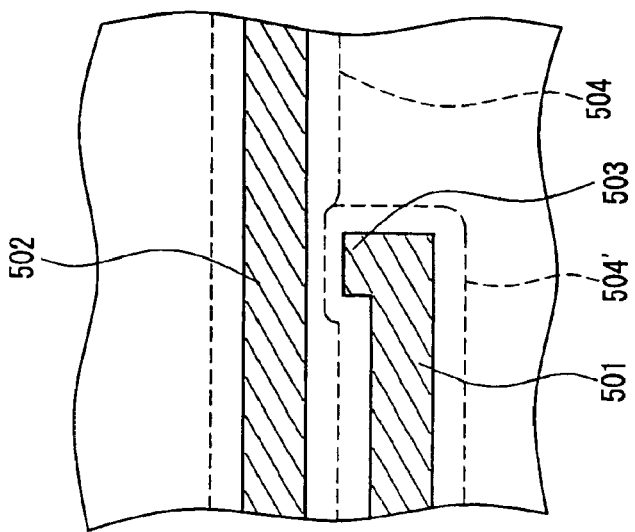
FIG. 5A is a wiring diagram showing a layout according to a fourth embodiment of the present invention.

FIGS. 5A and 5B show layouts according to a fourth embodiment of the present invention, while FIG. 5C shows a conventional layout. In FIG. 5C, a wiring 501 is arranged in parallel to a long and continuous wiring 502, at a spacing to allow edges 504 and 504' of an insulating protective film formed on the wirings to contact with each other. An end part of the wiring 501 is positioned at the center in FIG. 5C. In this case, a void 11 as shown in FIG. 10A exists at the clearance 505 between the edges 504 and 504', and this portion may not be coated completely with the insulating protective film. Therefore, micro-pores can be generated at the clearance 505 on the surface of the insulating protective film. A resist coated on this film may be decreased in thickness due to a leakage through the micro-pores, causing defects in the insulating film after an etching step for forming an aperture to expose a bonding pad.

For preventing this problem, the distance between the wirings will be decreased by forming at least one protrusion 503 at the end part of the wiring 501 to face the wiring 502 as shown in FIG. 5A In the example shown in FIG. 5A, the width of the wirings is 0.6 µm at the straight part. A distance between the wirings is 0.8 µm, a protrusion has an area of 0.8 µm², and a distance between the protrusion 503 and the wiring 502 is 0.6 µm.

Accordingly, deterioration of the insulating film at the clearance between the two wiring can be prevented. Alternatively, a protrusion 503' can be formed at a side of the wirings 502 to face the end part of the wiring 501 as shown in FIG. 5B.

The above-described layouts according to the embodiments include protrusions at corners of wirings or the like in order to allow the edges of the insulating protective films to contact each other. The protrusions will be formed at specified portions as required, while there are no substantial changes especially in the clearance between plural wirings arranged in parallel. As a result, wiring capacitance through an insulating protective film will not increase. Therefore, for a layout having a plurality of long wirings arranged adjacent and in parallel to each other, e.g., an address line for a SRAM (static random access memory), cross talk caused by a capacitance coupling between wirings in a same layer can be avoided. In addition, this system can provide a semiconductor device with high-speed performance.

The first to fourth embodiments refer mainly to pattern layouts of wirings or the like. Substantially, conventional manufacturing process can be applied to semiconductor devices including these layouts. That is, a bonding pad is formed on an insulating film formed on a semiconductor substrate, by using the wirings, the metal patterns or films having the same patterns as shown in the first to fourth embodiments. Then a protective insulating film is formed thereon. Next, a resist film is coated on the protective insulating film and an aperture pattern is formed on the bonding pad. Then, the insulating film is etched by using the resist pattern as a mask, thereby forming an aperture.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A semiconductor device comprising a plurality of wirings, wherein the wirings are formed adjacent to each other, each wiring comprises a first portion extending in a first direction, a second portion extending in a second direction different from to first direction and a corner at which the first and second portions meet, the first portions of the adjacent wirings are parallel to each other and the second portions of the adjacent wirings are parallel to each other, and a clearence is formed between the adjacent wirings, wherein a protrusion is formed at the corner of the wirings and the protrusion faces the clearance between the adjacent wirings.

2. The semiconductor device according to claim 1, wherein the protrusion protrudes outward from the corner.

3. The semiconductor device according to claim 1, wherein the protrusion is an inward extension bridging a corner portion.

4. A semiconductor device, wherein a plurality of conductive film patterns are formed on the semiconductor substrate, and the conductive film patterns are separated with a certain clearence by a T-shaped groove or a cross-shaped groove, the T-shaped groove or the cross-shaped groove is composed of two linear grooves, and a protrusion is formed at a corner of at least one of the conductive film patterns positioned at a crossing of the two linear grooves constituting the T-shaped groove or the cross-shaped groove, protruding from at least one corner of the conductive film patterns toward the T-shaped groove or the cross-shaped groove.

5. A semiconductor device, wherein wirings including a first wiring and a second wiring are formed substantially in parallel with a predetermined spacing on the semiconductor substrate, the second wiring having an end at a point intermediate the length of the first wiring, and at least one small protrusion is formed at a part of the end of the second wiring so as to protrude from a side of the second wiring toward a side of the first wiring perpendicular with respect to a direction that the second wiring extends, or at least one small protrusion is formed at a part of a side of the first wiring that faces the end of the second wiring so as to protrude toward the second wiring perpendicular with respect to a direction that the first wiring extends.

6. The semiconductor device according to claim 1, wherein the semiconductor substrate is provided further with a bonding pad made of the same film as the wirings, and the wirings and the bonding pad are coated with an insulating protective film having an aperture to expose the bonding pad, the insulating protective film forming a void in the clearance between the adjacent wirings.

7. The semiconductor device according to claim 4, wherein the semiconductor substrate is provided further with a bonding pad made of the same film as the conductive patterns, and the patterns and the bonding pad are coated with an insulating protective film having an aperture to expose the bonding pad, the insulating protective film forming a void in the groove between the conductive film patterns.

8. The semiconductor device according to claim 5, wherein the semiconductor substrate is provided further with a bonding pad made of the same film as the first and second wirings, and the wirings and the bonding pad are coated with an insulating protective film having an aperture to expose the bonding pad, the insulating protective film forming a void in the clearance between the wirings.

9. The semiconductor device according to claim 1, wherein the protrusion has an area ranging from 0.2 $\mu m^2$ to 3.0 $\mu m^2$.

10. The semiconductor device according to claim 1, wherein an insulating protective film is further provided on the clearance between the wirings, and the insulating protective film is contacted as a whole with the clearance between the wirings or the surface of the wirings.

11. A method of manufacturing a semiconductor device comprising a plurality of wirings, wherein the wirings are formed adjacent to each other, each wiring comprises a first portion extending in a first direction, a second portion extending in a second direction different from the first direction and a corner at which the first and second portions meet, the first portions of the adjacent wirings are parallel to each other and the second portion of the adjacent wirings are parallel to each other, and a clearance is formed between the adjacent wirings, wherein a protrusion is formed at the corner of the wirings and the protrusion faces the clearance between the adjacent wirings.

12. The method of manufacturing a semiconductor device according to claim 11, wherein the method comprises:

forming, on the semiconductor substrate, a bonding pad made of the same film as the wirings, forming an insulating protective film for covering the wirings and the bonding pad so that the insulating protective film forms a void in the clearance between the adjacent wirings, forming a patterned photosensitive resin film on the insulating protective film, and etching selectively the insulating protective film by using the photosensitive resin film as a mask, thereby forming an aperture in the insulating protective film to expose the bonding pad.

13. The method of manufacturing a semiconductor device according to claim 11, wherein the protrusion protrudes outward to the corner.

14. The method of manufacturing a semiconductor device according to claim 11, wherein the protrusion is an inward extension bridging a corner portion.

15. The method of manufacturing a semiconductor device, wherein conductive film patterns are provided with a T-shaped groove or a cross-shaped groove, the T-shaped groove or the cross-shaped groove being composed of two linear grooves, and a protrusion is formed at a corner of at least one of the conductive film patterns positioned at a crossing of the two linear grooves constituting the T-shaped groove or the cross-shaped groove, protruding from at least one corner of the conductive film patterns toward the T-shaped groove or the cross-shaped groove.

16. A method of manufacturing a semiconductor device, wherein wirings including a first wiring and a second wiring are formed substantially in parallel at a predetermined spacing on the semiconductor substrate, the second wiring having an end at a point intermediate the length of the first wiring, and at least one small protrusion is formed at a part of the end of the second wiring so as to protrude from a side of the second wiring toward a side of the first wiring perpendicularly respect to a direction that the second wiring extends, or at least one small protrusion is formed at a part of a side of the first wiring that faces the end of the second wiring perpendicularly with respect to a direction that the first wiring extends.

17. The method of manufacturing a semiconductor device according to claim 11, wherein the protrusion has an area ranging from 0.2 $\mu m^2$ to 3.0 $\mu m^2$.

18. The method of manufacturing a semiconductor device according to claim 12, wherein the insulating protective film is further contacted as a whole with the clearance between the wiring.

* * * * *